United States Patent [19]
Vishakhadatta et al.

[11] Patent Number: 6,028,727
[45] Date of Patent: Feb. 22, 2000

[54] METHOD AND SYSTEM TO IMPROVE SINGLE SYNTHESIZER SETTING TIMES FOR SMALL FREQUENCY STEPS IN READ CHANNEL CIRCUITS

[75] Inventors: G. Diwakar Vishakhadatta, Austin; Jerrell P. Hein, Driftwood, both of Tex.

[73] Assignee: Cirrus Logic, Inc., Fremont, Calif.

[21] Appl. No.: 08/924,190

[22] Filed: Sep. 5, 1997

[51] Int. Cl.[7] ....................................................... G11B 5/09
[52] U.S. Cl. ................................................ 360/51; 369/59
[58] Field of Search ........................... 360/46, 51; 369/59

[56] References Cited

U.S. PATENT DOCUMENTS

| | | | |
|---|---|---|---|
| 4,408,349 | 10/1983 | Yukawa | 455/182 |
| 4,864,437 | 9/1989 | Couse et al. | 360/75 |
| 4,979,055 | 12/1990 | Squires et al. | 360/69 |
| 5,170,299 | 12/1992 | Moon | 360/77.08 |
| 5,255,136 | 10/1993 | Machado et al. | 360/77.02 |
| 5,297,184 | 3/1994 | Behrens et al. | 375/98 |
| 5,321,559 | 6/1994 | Nguyen et al. | 360/46 |
| 5,335,365 | 8/1994 | Ballantyne et al. | 455/76 |
| 5,345,342 | 9/1994 | Abbott et al. | 360/48 |
| 5,384,671 | 1/1995 | Fisher | 360/51 |
| 5,422,760 | 6/1995 | Abbott et al. | 360/46 |
| 5,424,881 | 6/1995 | Behrens et al. | 360/40 |
| 5,459,679 | 10/1995 | Ziperovich | 364/602 |
| 5,572,558 | 11/1996 | Beherns | 375/376 |
| 5,576,904 | 11/1996 | Behrens | 360/51 |
| 5,638,230 | 6/1997 | Kadlec | 360/78.04 |
| 5,642,243 | 6/1997 | Bliss | 360/51 |
| 5,805,024 | 9/1998 | Takashi et al. | 360/51 |
| 5,892,632 | 4/1999 | Behrens et al. | 360/51 |

OTHER PUBLICATIONS

Cideciyan et al., "A PRML System for Digital Magnetic Recording," *IEEE J. on Sel. Com..*, Jan. 10, 1992.

Coker et al., "Implementation of PRML in a Rigid Disk Drive," *IBM Storage Systems Products Division*, Manuscript received Jul. 7, 1991.

Fields et al., "SA 19.1: A 200Mb/s CMOS EPRML Channel with Integrated Servo Demodulator for Magnetic Hard Disks," *IEEE Int'l Solid–State Circuits Conf*, Feb. 8, 1997.

Goodenough, "DSP Technique Nearly Doubles Disk Capacity," *Electronic Design*, 53–57, Feb. 4, 1993.

Reed et al., "Performance of A d=0 Demod/Remod Detector With Partial Erasure Matching," *Cirrus Logic*, Manuscript received Feb. 4, 1997.

Spalding et al., "SA 19.5: A 200Msample/s 6b Flash ADC in 0.6 $\mu$m CMOS, " *IEEE International Solid–State Circuits Conference*, Feb. 10, 1996.

Spurbeck et al., "Interpolated Timing Recovery for Hard Disk Drive Read Channels," *IEEE*, Aug., 1997.

(List continued on next page.)

*Primary Examiner*—W. Chris Kim
*Attorney, Agent, or Firm*—Richard D. Egan; Dan Shifrin

[57] ABSTRACT

A system and method is disclosed in which a circuit is provided to improve the settling performance of synthesizers used in read/write channel applications when the synthesizer is required to switch frequencies by a small percentage quickly. This is useful in read channel applications where the clock recovery is performed using an all-digital PLL. A digital timing recovery scheme is utilized in which one data frequency synthesizer provides both write and read frequencies. The read frequency is set higher than the write frequency to allow for oversampling when reading data from the storage medium. When changing from a write to read frequency or vice-versa the frequency synthesizer rapidly settles to the new frequency. The frequency synthesizer includes a phase locked loop which utilizes a controllable oscillator. The phase locked loop divisors are changed to obtain the desired frequency changes. An input signal to the controllable oscillator is also changed in order to obtain the rapid settling times. In one embodiment the oscillator is a current controlled oscillator and the control current to the oscillator is modified based on whether the data frequency synthesizer is utilized for a read operation or a write operation.

26 Claims, 7 Drawing Sheets

OTHER PUBLICATIONS

Tuttle et al., "TP 4.2: A 130Mb/s PRML Read/Write Channel with Digital–Servo Detection," IEEE International Solid–State Circuits Conference, Feb. 8, 1996.

Vanderkooy et al., "Resolution Below the Least Significant Bit in Digital Systems with Dither," *J. Audio Eng. Soc.*, 32(3), Mar. 1984.

Welland et al., "FA 17.1: A Digital Read/Write Channel with EEPR4 Detection," *IEEE International Solid–State Circuits Conference*, Feb. 18, 1994.

Welland et al., "Implementation of a Digital Read/Write Channel with EEPR4 Detection," *IEEE Transactions, Magnetics*; 31(2), Mar. 1995.

Welland et al., "Implementation of a Digital Read/Write Channel with EEPR4 Detection," —Outline; Crystal Semiconductor Corporation and Cirrus Logic; TMRC '94 Session:F2.

Yamasaki et al., SA 19.2: A 1,7 Code EEPR4 Read Channel IC with an Analog Noise Whitened Detector, *IEEE International Solid–State Circuits Conference*, Feb. 8, 1997.

METHOD AND SYSTEM TO IMPROVE SINGLE SYNTHESIZER SETTING TIMES FOR SMALL FREQUENCY STEPS IN READ CHANNEL CIRCUITS

BACKGROUND OF INVENTION

1. Field of the Invention

The present invention relates to frequency synthesizer circuits, and more particularly to frequency synthesizer circuits used for reading or writing data in data storage systems such as, for example, magnetic disk storage systems.

2. Description of Related Art

In data storage systems data is stored on a storage media such as a CD-ROM, writable CD, DVD or other optical disk, magnetic tape, magnetic hard disk, etc. Typically, when data is read from the storage media, some form of data detection circuitry is utilized to process the signal generated from or written to the storage media. In magnetic data storage systems, digital data serves to modulate the current in the read/write head coil so that a series of corresponding magnetic flux transitions may be written on to the medium. To read this recorded data, the read head passes over the medium and transduces the magnetic transitions into electrical pulses that alternate in polarity. These pulses are decoded by circuitry commonly called read/write channel circuitry to reproduce the digital data.

The storage medium generally contains at least two types of information or data. The first type of data may be called user data (sometimes referred to as just "data") and generally includes the data that an end user is saving or retrieving from the medium. The second type of information on the medium, called servo information or servo data, is used to determine the position of the read/write head on the medium. Servo information is generally embedded or written on the medium as part of the medium manufacturing process. Often, the two types of data stored on the medium are stored in alternating zones. For example, when information is to be obtained from the disk type medium it is generally transferred in alternating modes of operation, a "read operation" (for obtaining user data) and a "servo operation" (for obtaining servo information). When information is being transferred to a disk the mode of operation is generally called a "write operation."

Decoding the electrical pulses generated from a disk into a digital sequence is performed in most conventional designs by using a discrete time sequence detector in a sampled amplitude read channel. Discrete time sequence detectors are preferred to analog peak detect read channels since the discrete time systems can compensate for inter-symbol interference (ISI) and non-linearities in the medium, providing more reliable and robust data detection performance. There are several well known discrete time sequence detection methods for use in a sampled amplitude read/write channel circuit including discrete time pulse detection (DPD), partial response (PR) with Viterbi detection (partial response maximum likelihood (PRML) sequence detection), decision-feedback equalization (DFE), enhanced decision-feedback equalization (EDFE), and fixed-delay tree-search with decision-feedback (FDTS/DF). No matter what type of discrete methods are utilized for sampled amplitude read channel systems, an analog to digital converter (ADC) is typically utilized to convert the high frequency data which is contained on disk.

The conversion of the continuous electrical pulse into a discrete sample sequence involves the "sampling" of the input sequence. In data storage systems timing information often needs to be extracted from the data itself. This is usually performed by having a timing loop that can adjust the frequency and phase of sampling to acquire a correctly timed sequence since disk spin speed variations are likely to change the effective frequency and phase of the read data. In an analog timing recovery sequence, a variable frequency oscillator (VFO) is often used since the VFO can be sped up or slowed down depending on the decision of the timing recovery processing circuitry. Typically only the VFO and the sampler (generally an analog to digital converter) need to operate at the required sampling frequency. The VFO is used as part of a phase locked loop (PLL) where the data samples arc used to calculate a frequency and phase error that is fed back to the VFO. The VFO operates around a nominal frequency, which is the channel data rate. The closed loop system will settle (converge) to the correct sampling frequency and phase eventually. Such a system is shown in FIG. 1.

As shown in FIG. 1, a data detection system 5 (for example a read/write channel circuit) is provided. Input data 110 is provided to the data detection system 5 from a storage medium such as, for example, a magnetic hard disk. The data is first provided to a variable gain amplifier (VGA) 12 which in turn provides the data to a low pass filter (LPF) 14. The data from the low pass filter is then provided to an analog to digital converter (ADC) 16 for sampling the data. Offset control 17 may be provided around the analog to digital converter 16 to compensate for conversion offsets. From the analog to digital converter 16 the data is provided to a digital finite impulse response equalization filter (FIR) 18. A gain control circuit 19 may be provided to feedback gain adjustment to the variable gain amplifier 12. After the FIR 18, the data may be further processed by a Viterbi detector 20 and an RLL decoder 22 from which the digital data output 24 may be provid ed. As shown in FIG. 1, the ADC 16 is clocked by a PLL which includes a timing recovery circuit 28 and a VFO 26. The VFO may receive an input to set the nominal center frequency of the VFO. In addition, the VFO might possess a zero phase start (ZPS) circuit that is triggered by the data, which enables it to start the sampling process with a minimal phase error. A frequency synthesizer 35 is also provided to generate the clock for operating the various write circuitry of the data detection system. Further, another synthesizer (not shown) will be utilized to clock the servo data.

Digital timing recovery systems feature a different architecture. The sampling system (the ADC) is driven at a fixed sample frequency, and proper phase and frequency information is obtained by decimating (throwing away invalid samples) and interpolating between valid samples to achieve the correct sampling point. Digital timing recovery schemes are often preferred since they are easier to design, test and reproduce from part to part. The digital timing recovery systems avoid the use of a VFO to sample the data by using a synthesizer to sample the data. The synthesizer is a PLL that can be programmed to run at a set of given frequencies. If a synthesizer were used to sample the data at the nominal channel data rate, the disk spin speed variation s could cause the data to be undersampled. One potential solution to this problem is to oversample the read data by some small percentage that is enough to overcome the disk spin speed variations. In addition, the synthesizer's clock will tend to be asynchronous to the data. A digital PLL may be used to interpolate the sampled data to provide a data sequence that would appear to be correctly sampled to the Viterbi decoder. Such a system is shown in FIG. 1A. The data detection system of FIG. 1A is similar to that of FIG. 1 except for the clocking of the ADC 16 which is accomplished in the circuit of FIG. 1A with a frequency synthesizer 32. Frequency synthesizer 35 is also provided to generate the clock for operating the various write circuitry of the data detection system.

Utilizing the circuit of FIG. 1A, however, requires the read/write channel system to utilize two clocks for any data rate: a write clock which operates at the chosen, or nominal, channel data rate, and a read clock that is slightly higher in frequency from the channel data rate. The read circuitry is generally operated at a higher frequency because of the oversampling. To achieve oversampling, the read clock is usually required to be 2–5% higher in frequency than the data rate. This can be achieved by using 2 frequency synthesizers that are appropriately programmed to the desired frequencies. However, utilizing multiple synthesizers on the same read channel integrated circuit increase circuit size and cost and also creates problems related to cross talk, which causes the frequencies of the two synthesizers to drift towards each other. Cross talk may be significant between the read and write clocks because the frequencies of the two synthesizers are generally close, for example 2–5% apart as mentioned above.

SUMMARY OF INVENTION

The present invention addresses the problem above. A digital timing recovery scheme is utilized in which one data frequency synthesizer provides both write and read frequencies. The read frequency is set higher than the write frequency to allow for oversampling when reading data from the storage medium. The system utilizes less circuitry while minimizing cross talk since only one synthesizer needs to be built into the read channel IC. When changing from a write to read frequency or vice-versa the frequency synthesizer rapidly settles to the new frequency. The frequency synthesizer includes a phase locked loop which utilizes a controllable oscillator. The phase locked loop divisors are changed to obtain the desired frequency changes. An input signal to the controllable oscillator is also changed in order to obtain the rapid settling times. In one embodiment the oscillator is a current controlled oscillator and the control current to the oscillator is modified based on whether the data frequency synthesizer is utilized for a read operation or a write operation.

In one embodiment, a method for operating a read/write channel circuit having digital timing recovery is provided. The read/write circuit processes data read from and written to a disk storage medium. The method may include clocking write circuitry of the read/write channel circuit with a frequency synthesizer and clocking read circuitry of the read/write channel circuit with the same frequency synthesizer. The frequency synthesizer provides a first clocking frequency for write operations and a second clocking frequency for read operations. Settling times of the frequency synthesizer are decreased when changing between the first and second clocking frequencies by adjusting an electrical parameter within the frequency synthesizer in response to a signal indicating a change between the read and write operations.

In another embodiment, a method of operating a read/write channel circuit includes providing a single frequency synthesizer for clocking both read and write operations of the read/write channel circuit. The frequency synthesizer comprises a phase locked loop. A control signal is provided to a controllable oscillator within the phase locked loop. The method includes operating the frequency synthesizer at a write data rate for write operations and operating the frequency synthesizer at a read data rate for read operations, the read data rate being higher than the write data rate to provide oversampling during read operations. An additional electrical source is coupled to the control signal when the phase locked loop frequency is changed between the read data rate and the write data rate so that the settling time of the frequency synthesizer is decreased.

In another embodiment, a method of operating a data storage system, is provided. The method includes providing a data storage medium, writing data to the data storage medium at a write data rate and reading data from the data storage medium at an oversampled read data rate. A single frequency synthesizer generates a read clock signal for the read data rate and a write clock signal for write data rate. The settling time of the frequency synthesizer is decreased when changing between the read clock and the write clock by adjusting a control node within the frequency synthesizer.

The present invention may also include a read/write channel circuit for processing data from a data storage medium. The circuit may have read operation circuitry coupled to an input of the read/write channel circuit for receiving data from the data storage medium, and write operation circuitry coupled to an output of the read/write channel circuit for transmitting data to the data storage medium. The circuit may have a frequency synthesizer coupled to the read operation circuitry and the write operation circuitry. The frequency synthesizer provides a clock signal operating at a read data rate when the read/write channel circuit is in a read mode and a clock signal operating at a write data rate when the read/write channel circuit is in a write mode. The frequency synthesizer comprises a phase locked loop, a controllable oscillator within the phase locked loop, and a mode adjustment circuit coupled to the input of the controllable oscillator. The mode adjustment circuit provides a first electrical signal level to the controllable oscillator when the read/write channel circuit is in a read mode and a second electrical signal level to the controllable oscillator when the read/write channel circuit is in a write mode.

In yet another embodiment, a data storage system including a data storage medium and a data processing circuit coupled to the data storage medium is provided. The data processing circuit processes data to be read to and written from the data storage medium. A write clock signal operating at a first frequency is used when the data processing circuit is in a write mode and a read clock signal operating at a second frequency, is used when the data processing circuit is in a read mode, the read clock signal being at a higher rate than the write clock signal to allow oversampling of data during a read operation. The system includes a frequency synthesizer generating both the write clock signal and the read clock signal. The frequency synthesizer may have a controllable oscillator and an oscillator input, the oscillator input being coupled to a control signal which controls the controllable oscillator. A circuit is coupled to the oscillator input for adjusting the control signal a predetermined amount when an output frequency of the frequency synthesizer is changed between the write clock signal and the read clock signal so that the settling time of the frequency synthesizer is decreased.

BRIEF DESCRIPTION OF THE DRAWINGS

It is to be noted that the appended drawings illustrate only particular embodiments of the invention and are, therefore, not to be considered limiting of its scope, for the invention may include other effective embodiments.

DETAILED DESCRIPTION OF THE INVENTION

Figure 1:
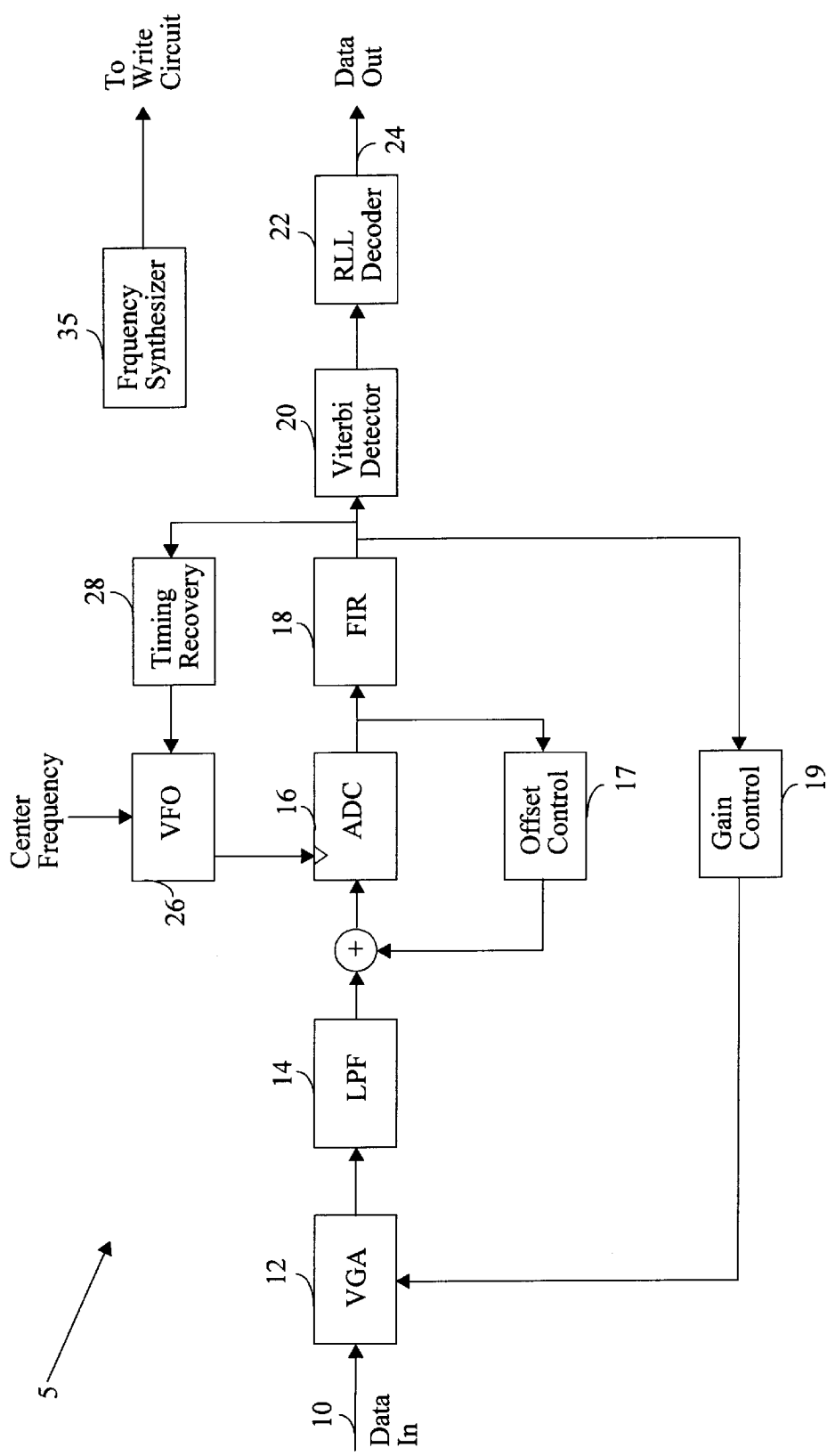
FIGS. 1 and 1A are block diagrams of the read path of read/write channel circuits.
Figure 1A:
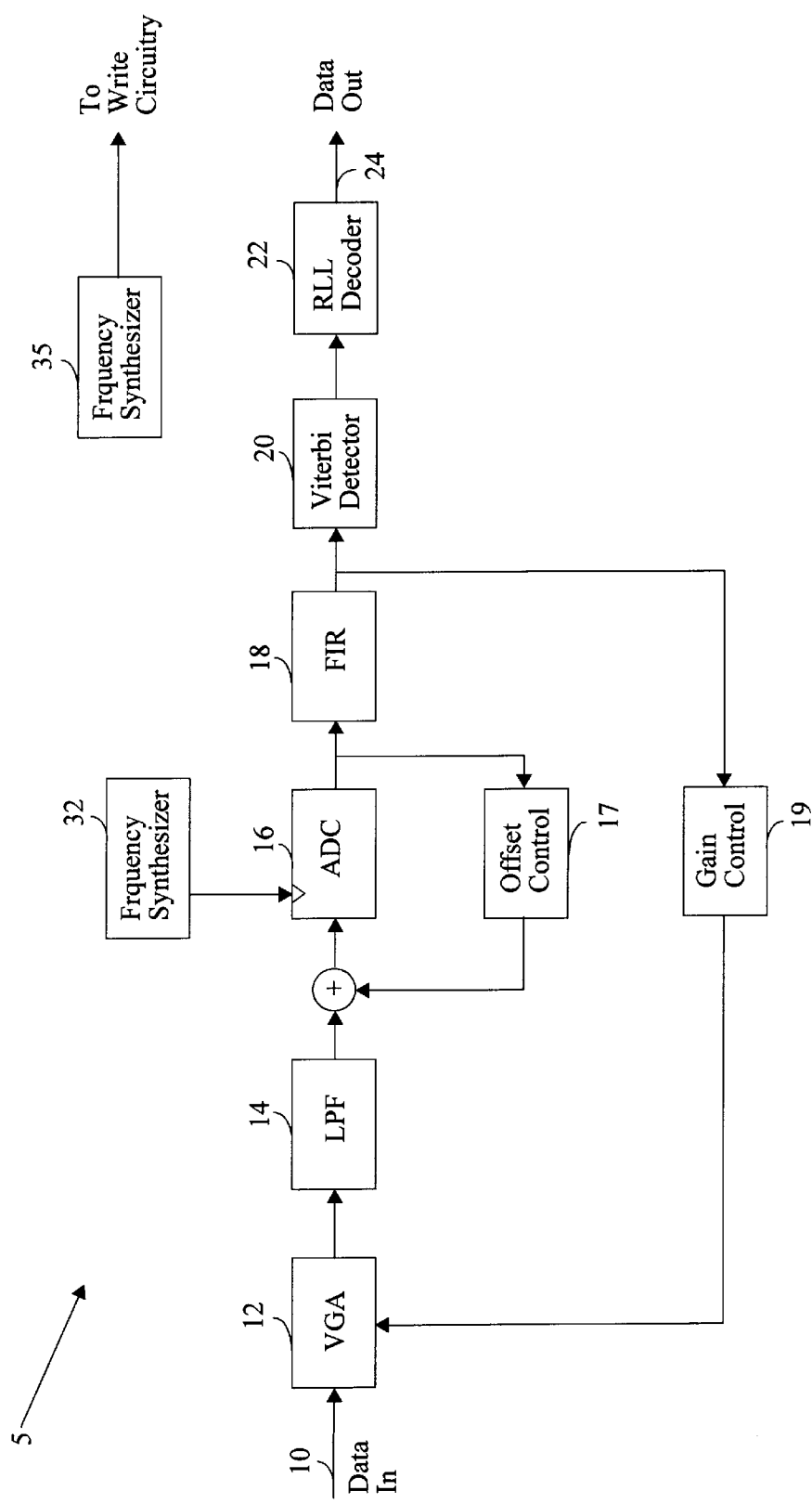
Figure 2:
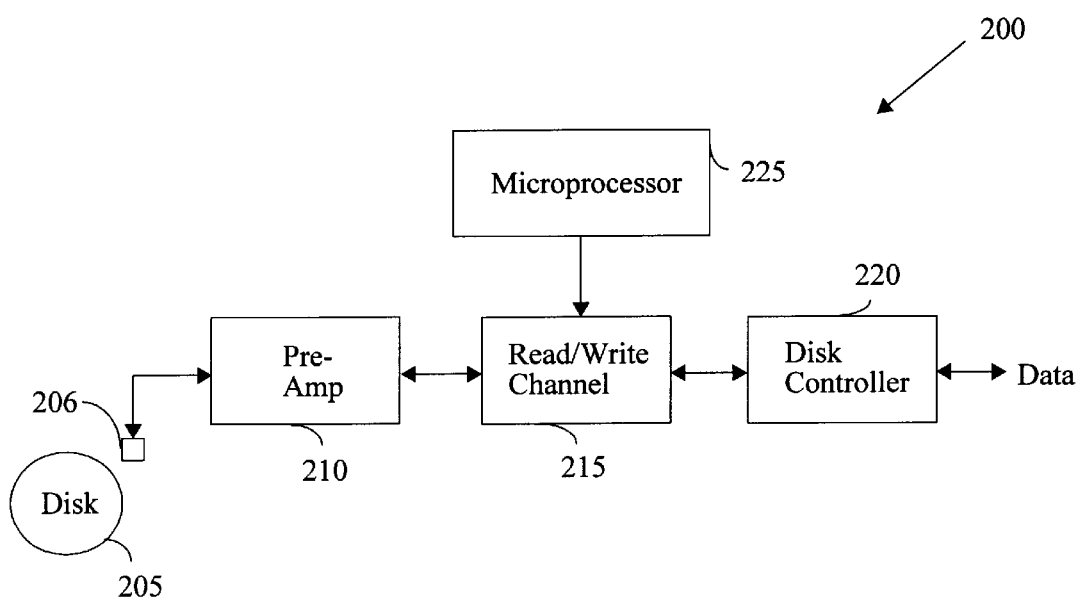
FIG. 2 is a block diagram of a data storage system.

FIG. 2 illustrates a data storage system 200 (for example a disk drive system) in which the present invention may be utilized. The disk drive system may include a disk 205, a read/write head 206, a pre-amp 210, a data detection/write circuit, a microprocessor 225, and a disk controller 220. The data detection/write circuit may be, for example, a read/write channel circuit 215. The disk 205, the read/write head 206, the pre-amp 210, the microprocessor 225, and the disk controller 220 may be implemented individually or in combination through the use of any of a wide variety of commercially available components. For example, the microprocessor may be a general 8-bit microprocessor, the disk controller may be a user's own custom ASIC or a commercially available controller such as the SH7600 available from Cirrus Logic, and the disk 205 and read/write head 206 may be any of a number of hard disks and heads available from hard disk manufacturers.

Data is read and written to the disk 205 by the head 206 which receives and transmits the data through a data path which includes the disk controller 220, the read/write channel circuit 215 and the preamp 210. The data storage system shown in FIG. 2 is just one illustrative example of a data storage system. Other data storage systems may also utilize the present invention. Further, though shown separately, various components of the data storage system may be combined or additional components may be considered to be part of the system including components such as RAM, ROM, power supply circuits, and other circuits. In addition, though shown as separate from a host computer, the data storage system may be integrally formed within a computer or alternatively, the data storage system may be formed as a stand alone unit independent of a host computer. Other data storage systems, for example optical disk drive systems, may also utilize the present invention. Moreover, certain features of the present invention are not limited to the use of data storage systems and may be utilized in many other electronic circuits in which frequency synthesizers are present.

Figure 3:
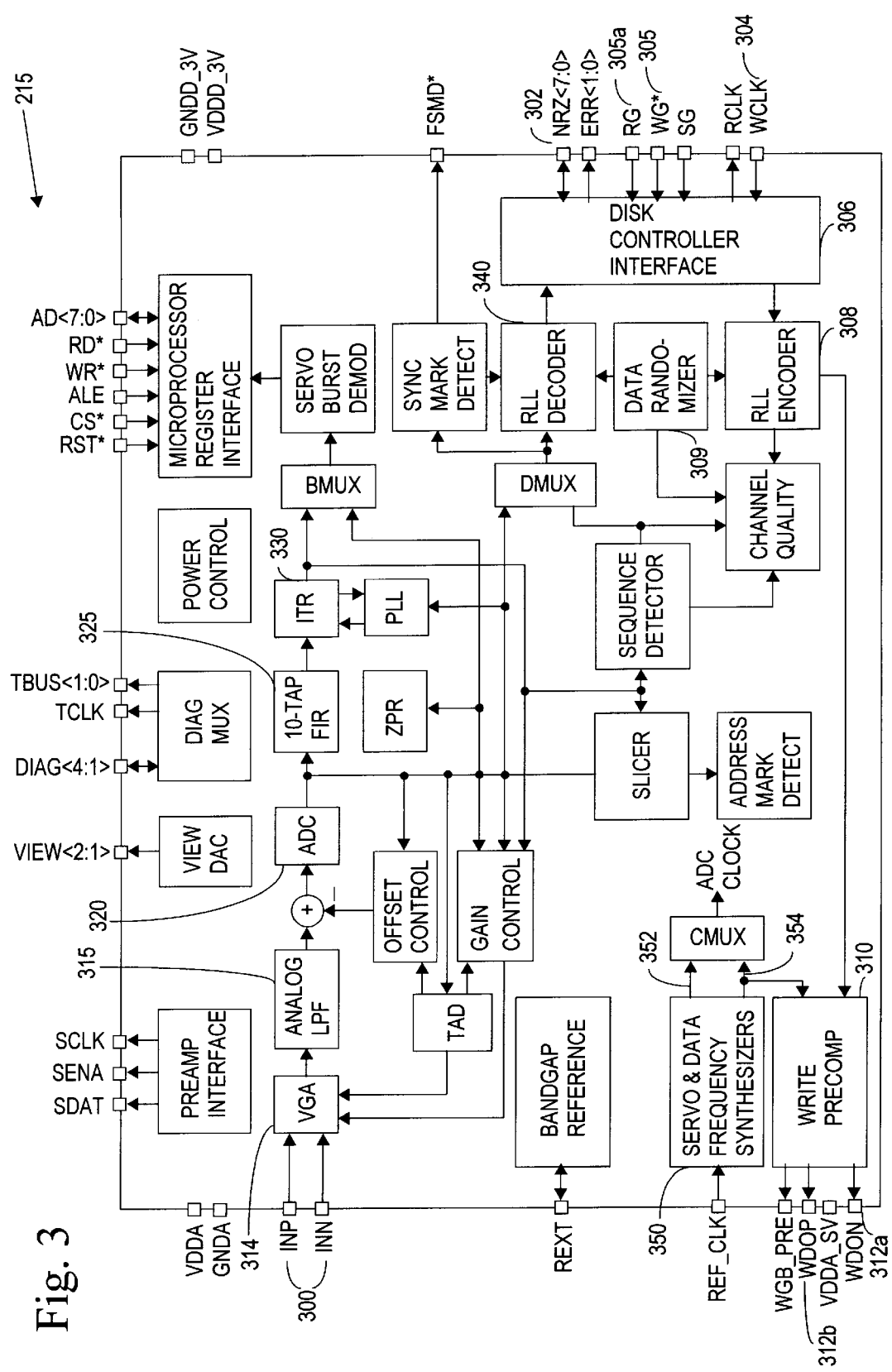
FIG. 3 is a block diagram of a read/write circuit.

FIG. 3 is a functional block diagram of the read/write channel circuit 215 of FIG. 2 implemented as a read/write channel. The read/write channel circuit 215 includes circuits for both the write path and the read path. Though a read/write channel circuit 215 is shown in FIGS. 2 and 3, the present invention may also be utilized in a circuit that does not include both read and write circuitry (i.e. a read channel only or write channel only circuit) if the circuit still requires the clock frequency to change small amounts very quickly. Thus, as used herein a read/write channel circuit may include circuits that have read only, write only, both read and write functions or additional functions. Moreover, it will be recognized that the read/write channel circuit 215 is just one exemplary circuit which may incorporate the circuits and techniques disclosed herein, and other read/write channel circuits may also utilized the disclosures made herein.

In the write path shown in FIG. 3, data is presented from the disk controller to the read/write channel circuit 215 at data bus pins 302 (NRZ <7:0>). The write mode (i.e. data being presented from the disk controller to the read/write channel circuit for writing on the disk) may be indicated through the use of a write signal on the WG pin 305. The data may be clocked in to the NRZ pins 302 according to a write byte clock pin 304. During a write operation, the data may be provided from a disk controller interface 306 to a data randomizer 309 and an RLL (run length limited) encoder 308. The data randomizer 309 may operate to remove periodic patterns that may exist in the data. The RLL encoder 308 operates to encode the data according to the RLL standard. From the RLL encoder 308 the data is provided to the write precompensation circuit 310. The output of the write precompensation circuit may be provided to a preamp through negative and positive write data output pins 312a and 312b (WDON and WDOP pins respectively).

In the read path shown in FIG. 3, data may be presented from the preamplifier 210 at the INP and INN pins 300. The read mode (i.e. when data is being presented from the disk through the pre-amp through the read/write channel circuit to the disk controller) may be indicated through the use of a read signal on the RG pin 305A. Read data may be presented from the read/write channel circuit 215 data bus pins 302 (NRZ <7:0>) to the disk controller. The analog read signal from the pre-amplifier (the signal at the INP and INN input pins 300) is provided to a variable gain amplifier (VGA) 314 to achieve a constant amplitude at the input to an analog low pass filter (LPF) 315. The output of the LPF 315 is provided to the ADC 320 which generates digital samples of the filtered signal. The asynchronous ADC 320 outputs may then be filtered through a digital finite impulse response equalization filter (FIR) 325 and a interpolated timing recovery filter (ITR) 330 to condition the signal to achieve a PR4 target and produce synchronous samples by digital interpolation of the asynchronous sample stream respectively. The ITR 330 output may be provided to a sequence detector 335 and then to the RLL decoder 340. Finally the read operation output may be provided through a disk controller interface 306 to the data bus pins 302.

In FIG. 3, clocks for servo operations, data operations and write operations are provided in the frequency synthesizer block 350. The frequency synthesizer block 350 includes two identical frequency synthesizers, the servo synthesizer and the data synthesizer. The data synthesizer generally provides a different frequency depending upon the location of the read/write head on the disk. Typically, nominal user data rates (for read and write operations) may vary from 50 to 350 MHz across the various zones of a disk storage medium. Within any given disk zone, the read frequency and the write frequency are generally the same (but for any oversampling variations). Servo data is generally fixed at a constant frequency across the whole disk. The fixed servo data rate often is at a single frequency between about 50 and 150 MHz. The servo synthesizer operates at the servo frequency and has an output 352. The data synthesizer nominally operates at the data frequency and has an output 354. A reference clock input may be provided to the frequency synthesizer block 350. The reference clock input typically is at a frequency between 20 and 60 MHz. Because the servo frequency synthesizer and the data frequency synthesizers are generally not operating at frequencies that are close, cross talk between the two synthesizers is minimized.

The data frequency synthesizer output 354 is provided to the write precompensation circuitry 310 to clock the writing of data to the disk and also provided to the ADC 320 to clock the sampling of data being read from the disk. A wide range of circuits may be utilized for either the write precompensation circuitry 310 or the ADC 320 and the invention herein is not limited to any one implementation of such circuits. Illustrative embodiments of the write precompensation circuitry may be found in U.S. patent application Ser. No. 08/902,832, entitled Read/Write Channel Write Precompensation System and Method, to Jerrell P. Hein, filed Jul. 30, 1997, and illustrative embodiments of the ADC circuitry may be found in U.S. patent application Ser. No. 08/927,122, entitled Method and System For Sliced Integration Of Flash Analog to Digital Converters In Read Channel Circuits, to Marius Goldenberg and Russell Croman, filed concurrently with the present application, the disclosures of these patent applications being expressly incorporated herein by reference.

As disclosed in more detail below, a single data synthesizer of the frequency synthesizer block 350 may provide clock signals at two different frequencies, one frequency for writing data and another frequency for reading data, with the read frequency being greater than the write frequency so that oversampling during read operations may occur. By utilizing one data synthesizer for both read and write operations circuit complexity, circuit size, and cross talk effects are all lessened. In one illustrative embodiment, the read frequency may be set higher than the write frequency (the nominal data rate) to provide the desired oversampling with the read frequency being higher by an amount of 10% or less, preferably higher by an amount of 2–5% and most preferably higher by an amount of 4.93%. Because the read/write channel circuitry must quickly switch between read operations and write operations, the data synthesizer utilizes circuit techniques to minimize the settling times of the clock output when switching from one operation to another.

Figure 4:
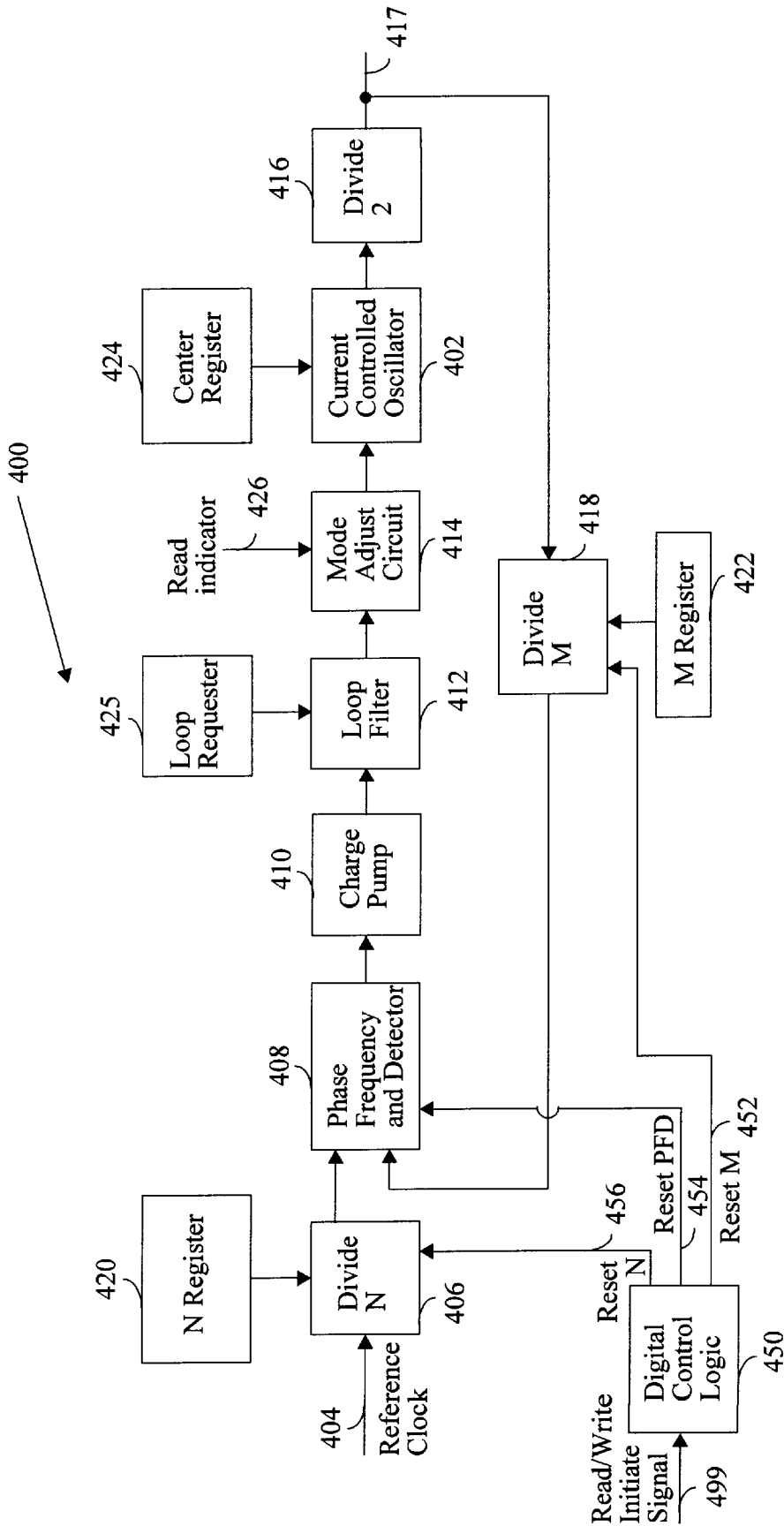
FIG. 4 is a diagram of a data frequency synthesizer according to the present invention.

FIG. 4 illustrates a frequency synthesizer 400 which may be utilized for the data frequency synthesizer of the frequency synthesizer block 350. As shown in FIG. 4, the frequency synthesizer 400 is a phase lock loop (PLL) which may include a current controlled oscillator 402 and a reference clock input signal 404. The phase locking loop is completed by feeding back the output of the oscillator to a phase/frequency detector which also receives the reference clock signal. More particularly, the reference clock 404 is provided to a divider circuit 406 which divides the reference clock signal by a value of N. The output of the divider 406 is provided as one input to the phase/frequency detector 408. The output of the phase/frequency detector is provided to a charge pump 410 which in turn provides an output to a loop filter 412. The current output of the loop filter 412 is provided to a mode adjust or settling circuit 414. The mode adjustment circuit 414 has an output which is provided to the current controlled oscillator 402. The output of the current controlled oscillator 402 is provided to a divider circuit 416 which divides the oscillator output by two. The output 417 of the frequency synthesizer 400 is provided as an output clock and also utilized in a feedback loop which is provided to the divider 418 which divides the output 417 by M. The output of the divider 418 is then provided as the second input to the phase/frequency detector 408.

Three registers 420, 422, and 424 are provided to control the frequency at the output 417 of the frequency synthesizer. The center register 424 sets the center operating frequency of the current controlled oscillator. Because the frequency synthesizer may operate over a wide frequency across the zones of a disk (for example 50 to 350 MHz), the operating range of the oscillator may be divided into multiple ranges. Each range may then have a corresponding nominal center operating frequency as provided by the center register. For example, a 50 to 350 MHz range may be divided into 8 frequency ranges and a center operating frequency value may be provided for each range by the center register 424. For any given range, the nominal center frequency provides sufficient operating room for both the read and write frequencies to be accommodated within the range so that the center register value is the same for a read and write operation within a given disk zone.

The M register 422 is a programmable register which sets the divisor of the divider 418 and the M register 420 is a programmable register which sets the divisor of the divider 406. The M and N values may be called the PLL loop divisors since the output frequency at the PLL output 417 is $F_S$, and is given by $$F_s = \left(\frac{M}{N}\right) F_{REF}$$

where $F_{REF}$ is the reference clock frequency which typically may be provided from a crystal oscillator which may have a frequency of between 20 and 60 MHz. The loop register 425 provides a programmable register through which to adjust the operating range of the loop filter 412. The operating range of the loop filter 412 should be adjusted to match the update rate of the phase/frequency detector 408 because the update rate varies with the reference frequency and the divisor N (update rate=$F_{REF} \div N$). Thus, the loop register 425 may be programmed with different values for read operations and write operations.

Though each M, N, and loop register (registers 420, 422, and 425 respectively) are shown as one register each, it will be recognized that each register may be composed of two registers, one for storing values for read operations and one for storing values for write operations for any given disk zone. Thus, when changing modes of operation the read and write registers for each value may be multiplexed to the corresponded circuit (the divide by M, divide by N, or loop filter circuits). For example, a read M register provides the M value to the M divider 418 during read operations and a write M register provides the M value to the M divider 418 during write operations.

The divider circuits 406, 416, and 418, the phase/frequency detector 408, the charge pump 410, the loop filter 412, and the controlled oscillator 402 may be any of a wide variety of standard circuits. For example, the M and N dividers 418 and 406 may be programmable digital counters that provide an output clock whose frequency is the input clock frequency divided by M or N respectively. The counter counts M or N pulses of the input clock and outputs a single pulse at the output. The phase/frequency detector 408 compares the outputs of the Divide by M circuit 418 and the Divide by N circuit 406 to provide an output that is proportional to the phase and frequency error between the two inputs to the detector. When the PLL is settled, the outputs of the Divide by M circuit 418 and the Divide by N circuit 406 have the same frequency and the same phase (i.e., the edges of the two clocks are in line with each other). When the two signals are not in phase, the phase/frequency detector 408 provides an UP or DOWN signal to the charge pump 410 to enable the oscillator to speed up or slow down. The charge pump 410 receives the digital UP or DOWN signals from the phase/frequency detector 408 and converts the signals into a current that serves to modulate voltages up or down in the loop filter 412.

The current from the charge pump either charges or discharges a resistor-capacitor network in the loop filter 412. When the PLL is settled, the voltages in the resistor-capacitor network do not change since the output of phase/frequency detector is zero and the charge pump does not provide any output current. Some of the loop filter capacitors are switchable and get switched in to receive current from the charge pump depending on the value in the loop register 425, which depends on the PLL update rate. By changing the effective capacitor value of the loop filter, the PLL is kept stable over the entire range of update rate settings. The output of the loop filter is a current that controls the current controlled oscillator 402. The current controlled oscillator 402 has an output frequency that is a function of its input current. Since the PLL may have a wide range of operating frequencies, capacitors in the oscillator may be switched in to slow down the oscillator to center the oscillator to a given frequency range for the same control current range.

Figure 6:
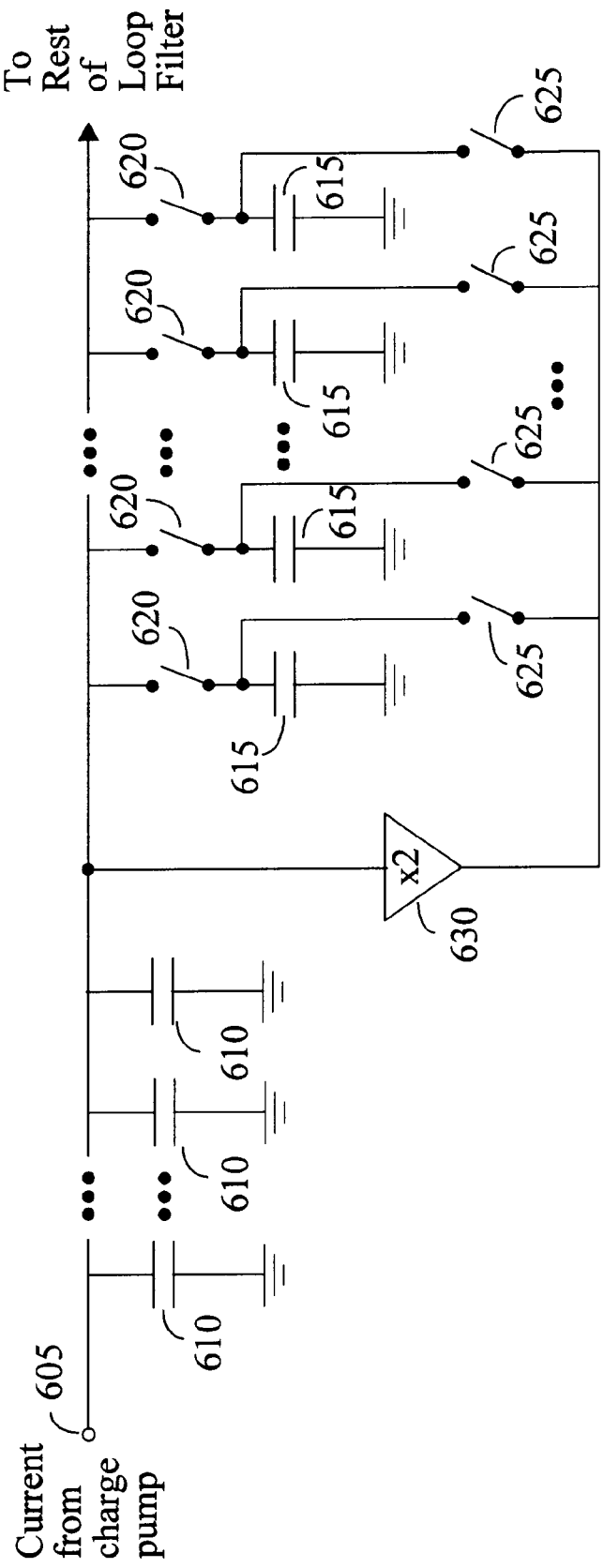
FIG. 6 is a capacitor network for use in a loop filter.

The input to the loop filter 412 is shown in FIG. 6. As shown in FIG. 6, the loop filter input includes a node 605 which is coupled to the charge pump. The network of capacitors may include capacitors 610 which are always coupled to the node 605 and switchable capacitors 615 which are switchable coupled to the node 605 through switches 620 which operate in response to the value of the loop register. When a read to write mode change (or vice-versa) is made, the PLL divisor N value changes which in turn changes the PLL update rate and thus may require a change in the loop register value. If changed, the new loop register value will then adjust which of the switches 620 are open or closed and thus which switchable capacitors 615 are coupled into the signal path. However, because adding or removing capacitors will impact the voltage on node 605 it is desirable to provide circuitry to minimize the impact to the signal path. In particular, the unity gain amplifier 630 and switches 625 are provided to minimize disturbances seen at node 605 when the loop register values are changed. For any given capacitor 620 that is not coupled to node 605 through a closed switch 615, the corresponding switch 625 is closed so that the capacitor is still held to the same voltage as is present on node 605. Then when the capacitor is to be coupled to the node 605, the switch 625 may be opened and switch 620 closed. In this manner, the instantaneous voltage disturbance at node 605 is minimized when a capacitor 615 is switched into the signal path. Thus, the loop filter output is minimally disturbed by a change in the loop register value.

With reference to FIG. 4 again, when the data synthesizer is switched from a read to write frequency, the values of M and N are changed to obtain the appropriate frequency change. In order to improve system stability, it may be desirable to reset and hold the M and N dividers while the M and N values are being changed. Further, because of the high switching speeds needed for many data storage systems, the mode adjustment (or settling) circuit 414 is utilized when switching from a read operation to a write operation or vice versa. More particularly, the mode adjustment (or settling) circuit 414 receives a read indicator signal 426 which indicates when the read operation is desired as opposed to a write operation. The circuit 414 increases the speed at which the data synthesizer output settles to the desired write or read frequency by adjusting the current supplied to the current controlled oscillator when the mode of operation is switched. Digital control logic 450 also receives the read/write initiate signal 499 in order to produce a reset M signal 452 for the divider 418, a reset N signal 456 for the divider 406, and a reset PFD signal 454 for the phase/frequency detector 408.

In one embodiment, when the data synthesizer is operating in a write mode and is switching to a read mode at a higher data frequency (for example 4.93% higher), the mode adjustment (or settling) circuit 414 adds additional current to the current supplied from the loop filter 412 so that the current supplied to the current controlled oscillator 402 is higher and thus the data synthesizer reaches the desired new frequency (the read frequency) quicker. Similarly, when the data frequency synthesizer is switched from a higher frequency (the read frequency) to a lower frequency (the write frequency) the mode adjustment (or settling) circuit 414 reacts by ceasing the addition of extra current to the current control oscillator. In this manner, the data synthesizer output also settles at the new desired lower frequency quicker.

Though the data frequency synthesizer of FIG. 4 has been discussed in relation to a current controlled oscillator, it will be recognized that the principles of the present invention may also be utilized with a phase lock loop system which utilizes a voltage controlled oscillator. In particular, it will be recognized that when switching from a read frequency to a write frequency (or vice-versa), rather than merely changing the phase lock loop divisors (for example the M and N values) additional signals within the phase lock loop may also be changed to decrease the time needed to settle from one frequency to another. For example, when using a voltage controlled oscillator, the mode adjustment (or settling) circuit 414 may be a circuit which raises or lowers the voltage input to the voltage controlled oscillator. Thus, though the settling circuit of FIG. 414 is shown as a current controlled circuit, other types of control circuits may be added to the phase lock loop to achieve the principles disclosed herein.

Figure 5:
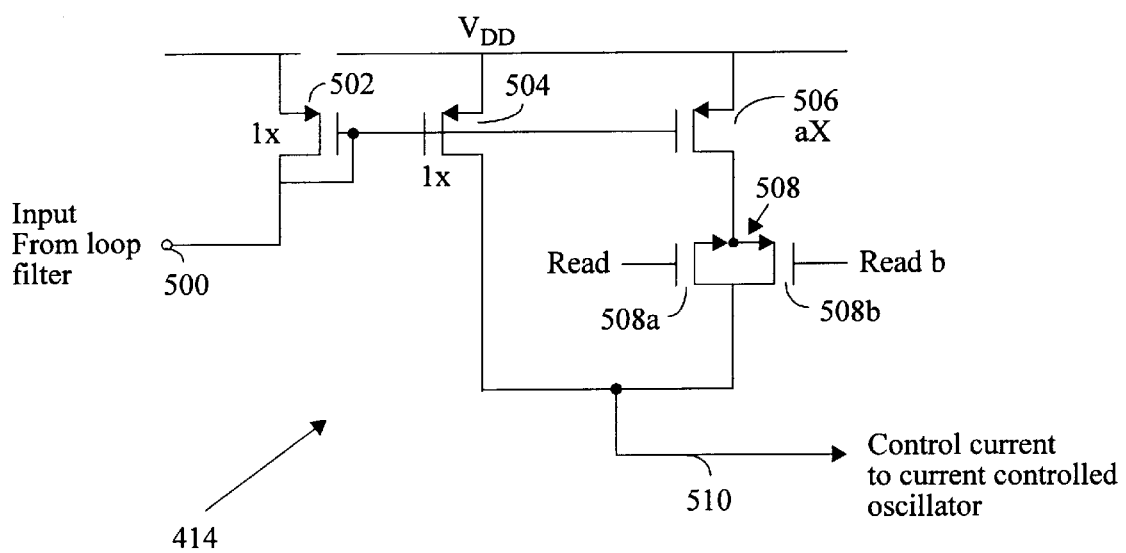
FIG. 5 is a circuit diagram of a settling circuit for use with the synthesizer of FIG. 4.

One exemplary circuit for use as the circuit 414 is shown in FIG. 5. As shown in FIG. 5, the mode adjustment (or settling) circuit 414 receives as an input from the loop filter a current signal at input node 500. The circuit input 500 is connected to a matched current mirror network which includes current mirror transistors 502, 504, and 506. Current mirror transistors 502 and 504 are matched to be sized the same as indicated by the "1X" labeling. Transistor 506 is sized down from transistors 502 and 504 by the factor of A. The gates of each transistor 502, 504, and 506 are coupled to each other and to input node 500 as shown. Current through transistor 502 generates the voltage on the transistor gates which forces the currents in transistors 504 and 506 to mirror the current through transistor 502 according to the transistor sizes.

A read mode switch 508 is provided through the use of switch transistors 508A and 508B which are coupled to the READ signal and its complement READB signal. During a write operation, the read signal is low such that the read mode switch 508 is opened. Thus, in the write operation, all of the control current supplied to the current controlled oscillator at the circuit output 510 is the current which passes through transistor 504. However, during a read operation, the current at the circuit output 510 is increased. This is accomplished by asserting the READ signal such that the read mode switch 508 passes current supplied from transistor 506. Now, during a read operation the control current supplied at the output node 510 of the mode adjustment (or settling) circuit 414 includes the current passed through transistor 504 plus the current passed through transistor 506. In this manner, additional current is supplied to the current controlled oscillator during a read operation which in turn enables the data frequency synthesizer to settle at the read frequency quicker. Likewise, when it is desired to change from a read operation to a write operation, the READ signal is again brought low. When the READ signal is low, the read mode switch 508 is again opened which decreases the current to the current controlled oscillator such that the output of the data frequency synthesizer settles at the write frequency quicker. Though described above with relation to a circuit which adds current for a read operation, it will be recognized that the present invention may also be utilized with a mode adjustment circuit with nominally has sufficient current for a read operation and removes current for a write operation. This, it will be recognized that a wide variety of mode adjustment or settling circuits may be utilized as long as the circuits provide some variation of an electrical parameter (typically voltage or current) when a mode of operation is to be changed so that the frequency synthesizer may settle more rapidly.

The frequency synthesizer block 350 of FIG. 3, also includes a servo frequency synthesizer. The servo frequency synthesizer may be similar to the synthesizer shown in FIG. 4, however, the settling circuits may not be necessary for use with the servo frequency synthesizer as rapid adjustments of the servo frequency are generally not necessary. Furthermore, it may be desirable to have multiple outputs from the frequency synthesizers in which additional divider circuits are coupled to the output of the current controlled oscillator. Thus, for example, the feedback loop of the frequency synthesizers may begin at the output of a divide by 2 circuit such as the divider circuit 416 of FIG. 4. However, the output of the current controlled oscillator 402 may also be coupled to additional divider circuits such as a divide by 3 and a divide by 4 circuit so that multiples of the output frequencies may be obtained at the output of the frequency synthesizers.

As mentioned above, one example amount of oversampling utilized for the read operations is 4.93% oversampling. To achieve the desired oversampling frequency, the amount of additional current adding in the circuit 414 may determined from generalized controlled current oscillator relationships. The oscillator in the PLL usually has a fixed relationship to the current that controls it. For example the oscillator frequency may relate to the control current I by:

$$f_{OSC} = Y [I]^K$$

where Y and K are constants, that depends on the actual circuits used. Thus, the relationship for two frequencies (for example a read frequency $f_R$ and a write frequency $f_W$ each having control currents $I_R$ and $I_W$ respectively) the relationship may be:

$$f_R/f_W = (I_R/I_W)^K$$

and thus for the case were $f_R = 1.0493 f_W$ and a typical K of 0.7 is utilized:

$$I2 = 1.0712 * I1$$

Therefore, with reference to FIG. 5 and using these exemplary calculations, when a change from the write mode to read mode is accomplished, the extra current source (transistor 506) should supply a current whose value is approximately 7.12% of the nominal control current source (transistor 504). Thus, if transistors 502 and 504 were sized to provide a current of 1X, then transistor 506 should be sized to provide a current of 0.0712X. It will be recognized, however, that the calculations disclosed herein are merely illustrative and that the principles of the present invention may be utilized with varying frequency changes and varying amounts of adjustments within the PLL to achieve the rapid settling times when switching from one frequency to another.

When a read to write mode (or vice-versa) change is desired, the control sequence may be as follows with reference to FIG. 4. First, the read/write initiate signal 499 is asserted to initiate a read or write sequence. The digital control logic 450 then asserts the reset PFD signal 454. The reset PFD signal 454 sets the output of the phase/frequency detector 408 to zero thus causing the output of the current controlled oscillator to remain constant. At the same time that the reset PFD signal 454 is asserted, the reset M signal 452 and the reset N signal 456 are also asserted. The assertion of the reset M signal 452 and the reset N signal 456 halts the outputs of the dividers 418 and 406 (i.e., no clock outputs provided). The M and N values provided to the dividers 418 and 406 respectively may then be changed. Then, the read indicator signal 426 is asserted to the mode adjust circuit 414. Next the reset N signal 456 is released and when a rising edge of the output clock of the divide by N divider 406 is detected, the reset M signal 452 and the reset PFD signal 454 are both released. Thus, the phase error between the N divider and the M divider outputs is minimized when M and N are changed This zero phase starting scheme may be used whenever a frequency change occurs (read to write, write to read, or disk zone changes). Using such a reset scheme further reduces the settling time of the synthesizer.

The frequency switching technique disclosed herein enables the oscillator to achieve the required frequency change rapidly. The PLL will still need to be "phase-locked" but the frequency transient is now almost eliminated. The output of the loop filter is nominally not expected to change after settling because the nominally expected change in the loop filter output for a read to write frequency change (or vice-versa) is modeled by the mode adjust circuit 414.

In an ideal circuit, the circuits and techniques discussed above would result in a near zero settling time. However, in the presence of mismatches, and process variations, frequency change settling time may be still be present, but greatly reduced. For a 4.93% change of frequency to settle to within 0.03% of the new frequency without using the improvements herein may require about 120 PLL updates (the update rate of the phase/frequency detector which is $F_{REF} \div N$). The settling time reduction, however, will be dependent upon the accuracy of the matching of transistors 502, 504 and 506 and other circuits. In practical circuits, a matching inaccuracy of 1% may be common which may result in settling to 0.03% of the desired new frequency in less than 60 PLL updates.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A method for operating a read/write channel circuit having digital timing recovery, the read/write circuit processing data read from and written to a disk storage medium, the method comprising:

clocking write circuitry of the read/write channel circuit with a frequency synthesizer;

clocking read circuitry of the read/write channel circuit with the frequency synthesizer, the frequency synthesizer providing a first clocking frequency for write operations and a second clocking frequency for read operations; and decreasing settling time of the frequency synthesizer when changing between the first and second clocking frequencies by adjusting an electrical parameter within the frequency synthesizer in response to a signal indicating a change between the read and write operations.

2. The method of claim 1, the frequency synthesizer including a controllable oscillator in a phase locked loop, the adjusting being an adjustment to a control signal of the oscillator.

3. The method of claim 2, the controllable oscillator being a current controlled oscillator and the adjustment to the control signal being achieved by coupling an additional current source to the control signal.

4. The method of claim 3, the current level of the additional current source being a predetermined amount.

5. The method of claim 1, the settling time being decreased by at least 50%.

6. A method of operating a read/write channel circuit, the method comprising:

providing a single frequency synthesizer for clocking both read and write operations of the read/write channel circuit, the frequency synthesizer comprising a phase locked loop;

providing a control signal to a controllable oscillator within the phase locked loop;

operating the frequency synthesizer at a write data rate for write operations;

operating the frequency synthesizer at a read data rate for read operations, the read data rate being higher than the write data rate to provide oversampling during read operations; and coupling an additional electrical source to the control signal when the phase locked loop frequency is changed between the read data rate and the write data rate so that the settling time of the frequency synthesizer is decreased.

7. The method of claim 6, the oscillator being a current controlled oscillator.

8. The method of claim 6, the coupling step further comprising increasing the level of the control signal with the additional electrical source during read operations.

9. The method of claim 6, wherein the read data rate is less than 10% higher than the write data rate.

10. The method of claim 6 wherein the settling time is approximately 60 phase locked loop updates or less.

11. A method of operating a data storage system, the method comprising:

providing a data storage medium;

writing data to the data storage medium at a write data rate;

reading data from the data storage medium at an oversampled read data rate;

generating from a single frequency synthesizer a read clock signal for the read data rate and a write clock signal for write data rate; and decreasing the settling time of the frequency synthesizer when changing between the read clock and the write clock by adjusting a control node within the frequency synthesizer.

12. The method of claim 11, further comprising:

coupling an additional electrical source to the control node when the frequency synthesizer output changes between the read data clock and the write data clock.

13. The method of claim 12 wherein the additional electrical source is a current source.

14. The method of claim 11 wherein the read clock frequency is higher than the write clock frequency, and the difference between the read clock frequency and the write clock frequency is less than 10%.

15. The method of claim 14 wherein the settling time of the frequency synthesizer is approximately 60 phase locked loop updates of the frequency synthesizer or less.

16. A read/write channel circuit for processing data from a data storage medium, the circuit comprising:

read operation circuitry, the read operation circuitry coupled to an input of the read/write channel circuit, the input for receiving data from the data storage medium;

write operation circuitry the write operation circuitry coupled to an output of the read/write channel circuit, the output for transmitting data to the data storage medium;

a frequency synthesizer coupled to the read operation circuitry and the write operation circuitry, the frequency synthesizer providing a clock signal operating at a read data rate when the read/write channel circuit is in a read mode and a clock signal operating at a write data rate when the read/write channel circuit is in a write mode, the frequency synthesizer comprising a phase locked loop;

a controllable oscillator within the phase locked loop; and a mode adjustment circuit coupled to the input of the controllable oscillator, the mode adjustment circuit providing a first electrical signal level to the controllable oscillator when the read/write channel circuit is in a read mode and providing a second electrical signal level to the controllable oscillator when the read/write channel circuit is in a write mode.

17. The read/write channel circuit of claim 16, the mode adjustment circuit comprising a current source switchably coupled to the input of the controllable oscillator.

18. The read/write channel circuit of claim 17, the current source providing an additional current to the oscillator during read operations.

19. The read/write channel circuit of claim 16, the controllable oscillator being a voltage controlled oscillator.

20. The read/write channel circuit of claim 16, the read data rate being higher than the write data rate, the read data rate being higher than the write data rate by an amount of 10% or less.

21. The read/write channel circuit of claim 20, the mode adjustment circuit having a mode indicator signal input and a second input, the second input being a part of the loop of the phase locked loop, the mode adjustment circuit having an output coupled to the input of the oscillator.

22. A data storage system, the system comprising:

a data storage medium;

a data processing circuit coupled to the data storage medium, the data processing circuit processing data to be read to and written from the data storage medium;

a write clock signal operating at a first frequency, the write clock signal used when the data processing circuit is in a write mode;

a read clock signal operating at a second frequency, the read clock signal used when the data processing circuit is in a read mode, the read clock signal being at a higher rate than the write clock signal to allow oversampling of data during a read operation;

a frequency synthesizer generating both the write clock signal and the read clock signal, the frequency synthesizer including a controllable oscillator;

an oscillator input, the oscillator input coupled to a control signal which controls the controllable oscillator; and a circuit coupled to the oscillator input, the circuit adjusting the control signal a predetermined amount when an output frequency of the frequency synthesizer is changed between the write clock signal and the read clock signal so that the settling time of the frequency synthesizer is decreased.

23. The data storage system of claim 22, the data storage medium being a disk storage medium.

24. The data storage system of claim 23, the read clock signal frequency being greater than the write clock signal frequency by an amount of approximately 10% or less.

25. The data storage system of claim 24, the circuit comprising an additional current source, the additional current source coupled to a phase locked loop signal of the frequency synthesizer.

26. The data storage system of claim 24, the oscillator being a voltage controlled oscillator.

* * * * *